United States Patent
Kum et al.

(10) Patent No.: US 10,336,924 B2
(45) Date of Patent: Jul. 2, 2019

(54) PRESSURE SENSITIVE ADHESIVE COMPOSITION AND PRESSURE SENSITIVE ADHESIVE PATTERN FORMED THERFROM

(71) Applicant: DONGWOO FINE-CHEM CO., LTD., Iksan-si, Jeollabuk-do (KR)

(72) Inventors: Joong Han Kum, Dangjin-si (KR); Jeong Ho Yoo, Hwaseong-si (KR); Kyoung Moon Jung, Jeollanam-do (KR); Bong Jin Choi, Pyeongtaek-si (KR); Han Young Choi, Pyeongtaek-si (KR)

(73) Assignee: Dongwoo Fine-Chem Co., Ltd., Jeollabuk-Do (KR)

( * ) Notice: Subject to any disclaimer, the term of this patent is extended or adjusted under 35 U.S.C. 154(b) by 0 days.

(21) Appl. No.: 15/893,267

(22) Filed: Feb. 9, 2018

(65) Prior Publication Data
US 2018/0223138 A1    Aug. 9, 2018

(30) Foreign Application Priority Data
Feb. 9, 2017  (KR) .......................... 10-2017-0017951

(51) Int. Cl.
*G03F 7/027*   (2006.01)
*G03F 7/033*   (2006.01)
*G03F 7/038*   (2006.01)
*C09J 133/08*  (2006.01)

(52) U.S. Cl.
CPC ............ *C09J 133/08* (2013.01); *G03F 7/027* (2013.01); *G03F 7/033* (2013.01); *G03F 7/038* (2013.01)

(58) Field of Classification Search
CPC ........ C09J 133/08; G03F 7/027; G03F 7/033; G03F 7/038
See application file for complete search history.

(56) References Cited

U.S. PATENT DOCUMENTS

| | | | | |
|---|---|---|---|---|
| 4,382,135 A * | 5/1983 | Sinka | ...................... | C07C 43/11 522/181 |
| 4,683,360 A * | 7/1987 | Maser | .................. | H01H 13/702 200/314 |
| 5,415,971 A * | 5/1995 | Couture | .................... | B24C 1/04 430/156 |
| 5,462,977 A * | 10/1995 | Yoshikawa | ........... | C08F 220/18 428/345 |
| 6,130,269 A * | 10/2000 | Hosokawa | ................. | C09J 4/00 522/100 |
| 2001/0023264 A1* | 9/2001 | Yamamoto | ......... | C08G 18/6229 522/39 |
| 2011/0028587 A1* | 2/2011 | Taguchi | ................. | G02B 5/201 522/75 |

FOREIGN PATENT DOCUMENTS

| | | | |
|---|---|---|---|
| KR | 1019970028792 A | 6/1997 | |
| KR | 1019970048906 A | 7/1997 | |
| KR | 1019990044707 A | 6/1999 | |
| WO | WO-9305123 A1 * | 3/1993 | ............... C09J 7/20 |

* cited by examiner

*Primary Examiner* — Cynthia Hamilton
(74) *Attorney, Agent, or Firm* — DLA Piper LLP (US)

(57) ABSTRACT

An pressure sensitive adhesive composition according to the present invention includes: an acrylic copolymer; a multi-functional acrylate-based compound; and a photoinitiator, in which the acrylic copolymer includes a repeating unit derived from an acrylate-based monomer having a Tg of −20° C. or less and a repeating unit derived from an unsaturated carboxylic acid monomer, and the repeating unit derived from the unsaturated carboxylic acid monomer is included in an amount of 10 to 50 parts by weight based on the total 100 parts by weight of the acrylic copolymer.

8 Claims, 1 Drawing Sheet

PRESSURE SENSITIVE ADHESIVE COMPOSITION AND PRESSURE SENSITIVE ADHESIVE PATTERN FORMED THERFROM

CROSS-REFERENCE TO RELATED PATENT APPLICATION

This U.S. non-provisional patent application claims priority under 35 U.S.C. § 119 of Korean Patent Application No. 10-2017-0017951 filed on Feb. 9, 2017 in the Korean Patent Office, the entire contents of which are hereby incorporated by reference.

FIELD OF INVENTION

The present invention relates to an pressure sensitive adhesive composition. More particularly, the present invention relates to an pressure sensitive adhesive composition capable of forming a pattern and an pressure sensitive adhesive pattern formed therefrom.

BACKGROUND

Photolithography is a method most widely used for forming various micro patterns such as a semiconductor, a thin film transistor, and a touch electrode, and is a method of obtaining a micro pattern after a material for forming a pattern is deposited on a substrate, and then a resist pattern corresponding to the pattern is formed by using a photoresist.

A typical method of forming a photoresist pattern by using a photoresist includes a film-forming process of applying a photosensitive resin composition for a photoresist on a deposition film of a material for forming a pattern, an exposure process of selectively irradiating a photoresist photosensitive resin film with light by using a mask prepared so as to correspond to a pattern to be formed, and a development process of obtaining a desired photoresist pattern by classifying the exposed region and the unexposed region to remove a region according to a positive system and a negative system.

In order to configure an electrophoresis display device, partition walls of the thus prepared photoresist pattern are filled with an ink, and a UV-curable adhesive, a heat-curable adhesive, a hot-melt-type adhesive, a pressure sensitive adhesive (PSA), or the like is typically used in order to bond the photoresist pattern to another base material. In this case, the UV-curable adhesive and the heat-curable adhesive have a problem in that it is difficult to apply the adhesive only on the partition wall, and since a high temperature of 100° C. or more should be applied to the hot-melt-type adhesive, the hot-melt-type adhesive has a problem in that a solvent included in an ink between the partition walls is volatilized when heated, and also has a disadvantageous effect in that the economic feasibility is insufficient because an expensive pressure sensitive adhesive is additionally needed when a photoresist pattern is bonded to a bonding surface of another base material by using a pressure sensitive adhesive.

Therefore, in order to solve the problems in the related art, there is a need for developing an pressure sensitive adhesive composition capable of simultaneously performing an pressure sensitive adhesive function while being capable of forming a pattern.

Korean Patent Publication No. 1997-0028792 relates to a photosensitive resin composition, and discloses a photosensitive resin composition consisting of a polymer conjugate, a photopolymerization initiator, and a photopolymerizable monomer including at least one terminal ethylenic unsaturated group, in which the photosensitive resin composition simultaneously contains photopolymerizable monomers represented by General Formulae (I), (II), and (III).

Korean Patent Publication No. 1997-0048906 relates to a photosensitive resin composition, and discloses a photosensitive resin composition containing at least one water soluble monomer having two or more unsaturated reactive groups capable of being addition polymerized and at least one water insoluble monomer as photopolymerizable monomers, in which the water soluble monomer is included in an amount of 3 to 15% based on solid content, and the total amount (#M) of the reactive groups of the photopolymerizable monomers is 0.5~1.5 moles in 1 kg of the solid content.

Further, Korean Patent Publication No. 1999-0044707 relates to a dry film photoresist, and discloses a dry film photoresist prepared by sequentially laminating a protective film, a photosensitive polymer layer, and a support film, in which the protective film is a polyethylene terephthalate biaxially stretched film satisfying surface characteristics represented by Equation 1.

However, in the case of these documents, the pressure sensitive adhesive performance is not exhibited because a photoresist pattern should be bonded to another base material by heating the photoresist pattern to 100° C. or more in order to bond the photoresist pattern to the another base material and a material for forming the photoresist pattern has a high Tg, and the solvent component of an ink for an electrophoresis display device are not prevented from being volatilized.

PRIOR-ART DOCUMENTS

Patent Documents (Patent Document 1) Korean Patent Publication No. 1997-0028792 (Jun. 24, 1997)
(Patent Document 2) Korean Patent Publication No. 1997-0048906 (Jul. 29, 1997)
(Patent Document 3) Korean Patent Publication No. 1999-0044707 (Jun. 25, 1999)

SUMMARY OF THE INVENTION

Technical Problem

A technical objective of the present invention is to provide an pressure sensitive adhesive composition having adhesion characteristics and pattern formability.

Another technical objective of the present invention is to provide an pressure sensitive adhesive composition capable of being applied as a photoresist pattern after being photocured.

Yet another technical objective of the present invention is to provide an pressure sensitive adhesive pattern formed of the aforementioned pressure sensitive adhesive composition, specifically, a photoresist pattern.

Solution to Problem

In order to achieve the objectives, an pressure sensitive adhesive composition according to the present invention includes: an acrylic copolymer; a multifunctional acrylate-based compound; and a photoinitiator, in which the acrylic copolymer includes a repeating unit derived from an acrylate-based monomer having a Tg of −20° C. or less and a repeating unit derived from an unsaturated carboxylic acid monomer, and the repeating unit derived from the unsaturated carboxylic acid monomer is included in an amount of 10 to 50 parts by weight based on the total 100 parts by weight of the acrylic copolymer.

Further, the present invention provides an pressure sensitive adhesive pattern formed of the aforementioned pressure sensitive adhesive composition and having a Tg of 0° C. or less.

Advantageous Effects

There is an advantageous effect in that a photoresist pattern can be formed because the pressure sensitive adhesive composition according to the present invention has excellent pressure sensitive adhesiveness and excellent pattern formability when cured.

In addition, there is an advantageous effect in that it is possible to prevent a solvent in an ink which is filled between the partition walls of the photoresist patterns from being volatilized by curing the pressure sensitive adhesive composition according to the present invention at high temperature because the pressure sensitive adhesive composition can be easily cured by using UV rays.

Also, there is an advantageous effect in that the pressure sensitive adhesive pattern is excellent in terms of process because the pressure sensitive adhesive pattern according to the present invention can be formed at one time by using the pressure sensitive adhesive composition according to the present invention without having to separately use a photoresist composition and an pressure sensitive adhesive.

DETAILED DESCRIPTION OF THE INVENTION

Figure 1:
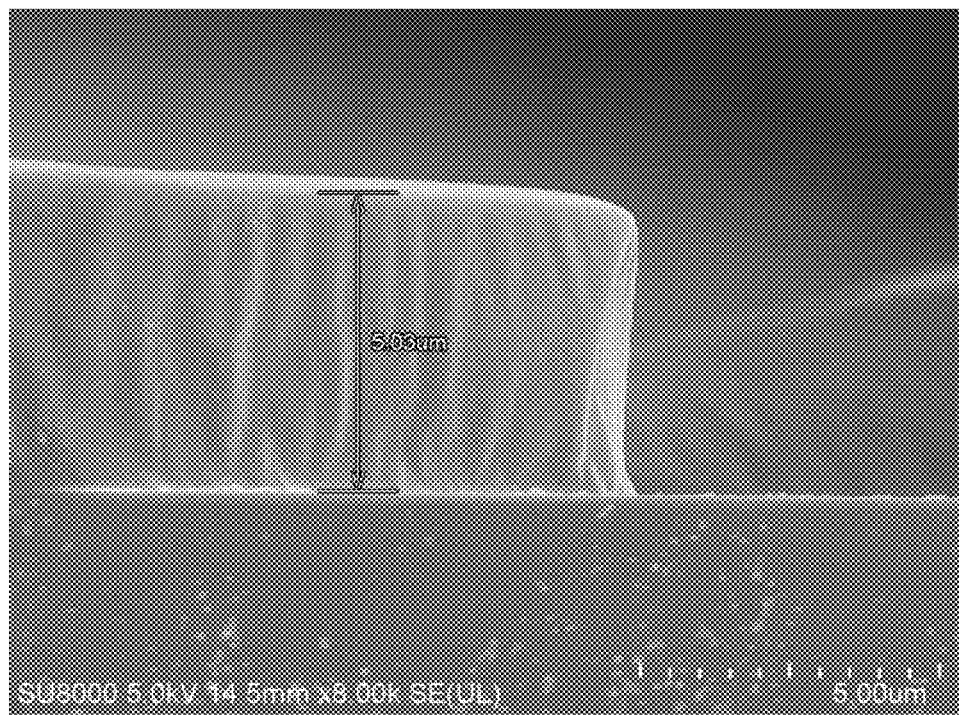
FIGS. 1 and 2 are a front surface photograph and a side surface photograph of an pressure sensitive adhesive pattern according to some exemplary embodiments of the present invention, respectively.

Hereinafter, the present invention will be described in more detail.

When one member is disposed "on" another member in the present invention, this includes not only a case where the one member is brought into contact with another member, but also a case where still another member is present between the two members.

When one part "includes" one constituent element in the present invention, unless otherwise specifically described, this does not mean that another constituent element is excluded, but means that another constituent element may be further included.

An aspect of the present invention relates to an pressure sensitive adhesive composition including: an acrylic copolymer; a multifunctional acrylate-based compound; and a photoinitiator, in which the acrylic copolymer includes a repeating unit derived from an acrylate-based monomer having a glass transition temperature (Tg) of −20° C. or less and a repeating unit derived from an unsaturated carboxylic acid monomer, and the repeating unit derived from the unsaturated carboxylic acid monomer is included in an amount of 10 to 50 parts by weight based on the total 100 parts by weight of the acrylic copolymer.

The acrylic copolymer according to the present invention includes a repeating unit derived from an acrylate-based monomer having a Tg of −20° C. or less and a repeating unit derived from an unsaturated carboxylic acid monomer. Specifically, the acrylic copolymer may be prepared by copolymerizing the acrylate-based monomer having a Tg of −20° C. or less with the unsaturated carboxylic acid monomer.

The acrylate-based monomer is not limited as long as the Tg is −20° C. or less. For example, the acrylate-based monomer is a compound having a Tg of −20° C. or less and having a (meth)acryloyl group as a photocurable functional group, and examples thereof include n-butyl acrylate, 2-butyl acrylate, t-butyl acrylate, 2-ethylhexyl(meth)acrylate, ethyl acrylate, n-propyl acrylate, isopropyl acrylate, pentyl acrylate, n-octyl(meth)acrylate, isooctyl(meth)acrylate, nonyl(meth)acrylate, decyl(meth)acrylate, lauryl(meth)acrylate, and the like.

Specifically, the acrylate-based monomer according to the present invention may be butyl acrylate.

The repeating unit derived from the acrylate-based monomer may serve to impart pressure sensitive adhesiveness to the pressure sensitive adhesive composition. Specifically, an pressure sensitive adhesive composition having much better pressure sensitive adhesiveness may be obtained because the acrylate-based monomer according to the present invention has a low Tg.

As the unsaturated carboxylic acid monomer, it is possible to use an unsaturated monocarboxylic acid, an unsaturated dicarboxylic acid, an unsaturated polyvalent carboxylic acid, and the like.

Specifically, examples of the unsaturated monocarboxylic acid include acrylic acid, methacrylic acid, crotonic acid, α-chloroacrylic acid, cinnamic acid, and the like. Examples of the unsaturated dicarboxylic acid include maleic acid, fumaric acid, itaconic acid, citraconic acid, mesaconic acid, and the like. The unsaturated polyvalent carboxylic acid may also be an acid anhydride, and specific examples thereof include maleic anhydride, itaconic anhydride, citraconic anhydride, and the like. In addition, the unsaturated polyvalent carboxylic acid may also be a mono(2-methacryloyloxyalkyl)ester thereof, and examples thereof include mono(2-acryloyloxyethyl)succinate, mono(2-methacryloyloxyethyl)succinate, mono(2-acryloyloxyethyl)phthalate, mono(2-methacryloyloxyethyl)phthalate, and the like. The unsaturated polyvalent carboxylic acid may also be a mono(meth)acrylate of a dicarboxy polymer at the two ends thereof, and examples thereof include ω-carboxypolycaprolactone monoacrylate, ω-carboxypolycaprolactone monomethacrylate, and the like. The unsaturated monomer having the carboxylic groups may be used either alone or in mixture of two or more thereof.

Specifically, the unsaturated carboxylic acid monomer according to the present invention may be acrylic acid.

The repeating unit derived from the unsaturated carboxylic acid monomer enables the realization of photoresist performance. When the repeating unit derived from the unsaturated carboxylic acid monomer is included in the acrylic copolymer, developability can be imparted during development in an aqueous basic solution.

In an exemplary embodiment of the present invention, the acrylic copolymer may have a weight average molecular weight of 10,000 to 100,000, preferably 30,000 to 100,000, and more preferably 50,000 to 80,000. When the weight average molecular weight of the acrylic copolymer satisfies the range, there is an advantageous effect in that an pressure sensitive adhesive pattern having excellent durability can be formed. When the weight average molecular weight of the acrylic copolymer is less than the range, pressure sensitive adhesive durability and solvent resistance may slightly deteriorate due to slightly insufficient cohesion between the copolymers, and when the weight average molecular weight of the acrylic copolymer is more than the range, processability (pattern formability) may slightly deteriorate due to a slight increase in viscosity, so that it is preferred that the acrylic copolymer is included in an amount within the range.

The repeating unit derived from the unsaturated carboxylic acid monomer is included in an amount of 10 to 50 parts by weight based on the total 100 parts by weight of the acrylic copolymer, and in this case, there is an advantageous effect in that a pattern is easily formed.

In another exemplary embodiment of the present invention, the repeating unit derived from the acrylate-based monomer may be included in an amount of 50 to 90 parts by weight based on the total 100 parts by weight of the acrylic copolymer.

When the repeating unit derived from the acrylate-based monomer and the repeating unit derived from the unsaturated carboxylic acid monomer are included in an amount within the ranges based on the total 100 parts by weight of the acrylic copolymer, there is an advantageous effect in that it is possible to obtain an pressure sensitive adhesive composition having excellent pressure sensitive adhesiveness and excellent pattern formability. Specifically, the acrylic copolymer according to the present invention has solubility in an aqueous alkaline solution prior to exposure and is cured after the exposure, and thus solubility with respect to the aqueous alkaline solution is lost, and a pattern is able to be formed, and since the exposed portion is cured and pressure sensitive adhesive strength is improved, there is an advantageous effect in that a photoresist pattern can be easily formed by using only the pressure sensitive adhesive composition according to the present invention without having to separately use a photoresist composition and an pressure sensitive adhesive composition, which are used in the related art.

In yet another exemplary embodiment of the present invention, the acrylic copolymer may further include a second photocurable functional group. The "second photocurable functional group" may be the same as or different from the "first photocurable functional group" to be described below.

In order to have a second photocurable functional group in the acrylic copolymer, the second photocurable functional group may be prepared by reacting a compound having both a photocurable functional group and a functional group that reacts with a carboxylic acid with a repeating unit derived from an unsaturated carboxylic acid monomer, and examples of the compound having both the photocurable functional group and the functional group reacting with a carboxylic acid include a (meth)acrylate-based compound containing an isocyanate group or an epoxy group, or a vinyl-based compound, and an allyl-based compound.

Specifically, glycidyl ether methacrylate or 2-isocyanatoethyl methacrylate may be used, and a combination of two or more species may be used, but the compound is not limited thereto.

The second photocurable functional group may be, for example, an acrylic group, a methacrylic group, an allyl group, and a vinyl group, but is not limited thereto.

In still another exemplary embodiment of the present invention, the second photocurable functional group may be included in an amount of 1 to 20 parts by weight based on the total 100 parts by weight of the acrylic copolymer.

For example, an acrylic copolymer represented by the following Chemical Formula 3 may be obtained by reacting 10 parts by weight of glycidyl methacrylate (GMA) with an acrylic copolymer consisting of 70 parts by weight of butyl acrylate and 30 parts by weight of acrylic acid based on the total 100 parts by weight of the copolymer.

[Chemical Formula 3]

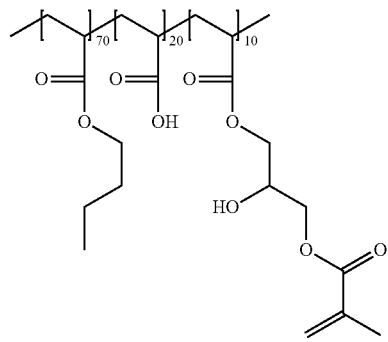

Specifically, the second photocurable functional group may be included in the acrylic copolymer by reacting a compound including the second photocurable functional group with a portion of the carboxylic acid included in the acrylic copolymer.

The acrylic copolymer may be included in an amount of 40 to 90 parts by weight, preferably 60 to 80 parts by weight, and more preferably 75 to 85 parts by weight based on the total 100 parts by weight of the pressure sensitive adhesive composition. When the acrylic copolymer is included in an amount within the range, an pressure sensitive adhesive composition having excellent pressure sensitive adhesiveness and pattern formability may be obtained. When the acrylic copolymer is included in an amount less than the range, pressure sensitive adhesiveness may slightly deteriorate, and when the acrylic copolymer is included in an amount more than the range, processability may slightly deteriorate as viscosity is slightly increased, so that it is preferred that the acrylic copolymer is included in an amount within the range.

The pressure sensitive adhesive composition according to the present invention includes a multifunctional acrylate-based compound. When the multifunctional acrylate-based compound is included in the pressure sensitive adhesive compound, there is an advantageous effect in that the degree of curing of an pressure sensitive adhesive pattern formed of the pressure sensitive adhesive composition becomes excellent.

In yet another exemplary embodiment of the present invention, the multifunctional acrylate-based compound may include: two or more first photocurable functional groups; and one or more functional groups selected from the group consisting of an acid group and an ethylene glycol group in a molecule thereof.

The first photocurable functional group may be the same as or different from the second photocurable functional group. In summary, the first photocurable functional group and the second photocurable functional group may be used interchangeably.

The first photocurable functional group may be, for example, an acrylic group, a methacrylic group, an allyl group, or a vinyl group, but is not limited thereto.

Examples of the acid group include a carboxylic group and a phenolic hydroxyl group, but are not limited thereto.

In the present invention, the multifunctional acrylate-based compound may be represented by the following Chemical Formula 1 or Chemical Formula 2.

[Chemical Formula 1]

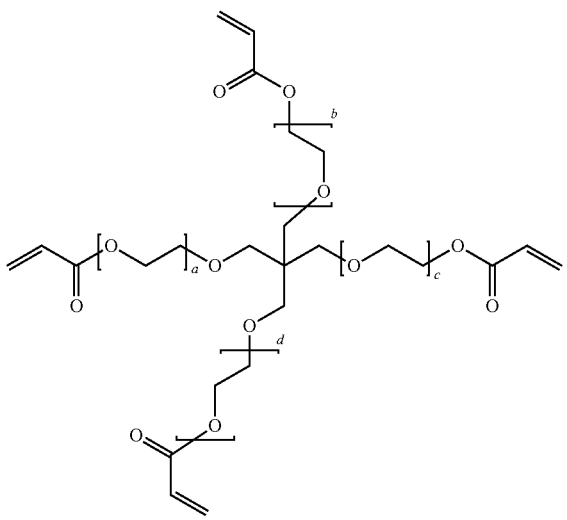

In Chemical Formula 1, a to d each are an integer from 0 to 10, and a+b+c+d=an integer from 4 to 40.

[Chemical Formula 2]

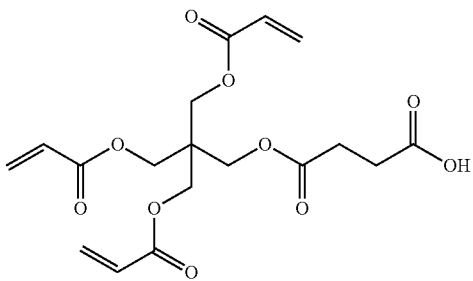

When the multifunctional acrylate-based compound according to the present invention includes one or more selected from the group consisting of the compounds represented by Chemical Formulae 1 and 2, there is an advantageous effect in that the solubility in an aqueous alkaline solution is improved because the multifunctional acrylate-based compound has an excellent degree of curing and includes a hydrophilic moiety or an acidic moiety in the [moiety].

In a different exemplary embodiment of the present invention, the multifunctional acrylate-based compound may be included in an amount of 10 to 60 parts by weight, preferably 20 to 40 parts by weight, and more preferably 25 to 35 parts by weight, based on the total 100 parts by weight of the pressure sensitive adhesive composition. When the multifunctional acrylate-based compound is included in an amount within the range, there is an advantageous effect in that the multifunctional acrylate-based compound serves to supplement the degree of curing, and thus, an pressure sensitive adhesive pattern having excellent physical properties can be formed. When the multifunctional acrylate-based compound is included in an amount less than the range, the degree of curing may slightly deteriorate, and when the multifunctional acrylate-based compound is included in an amount more than the range, as the curing proceeds somewhat excessively, pressure sensitive adhesiveness may slightly deteriorate, so that it is preferred that the multifunctional acrylate-based compound is included in an amount within the range.

In another different exemplary embodiment of the present invention, the pressure sensitive adhesive composition may be alkali soluble. Specifically, the acrylic copolymer according to the present invention may be a developable acrylic copolymer, and the multifunctional acrylate-based compound according to the present invention may be a developable multifunctional acrylate-based compound. Since the pressure sensitive adhesive composition exhibits alkali solubility, the pressure sensitive adhesive composition according to the present invention can be subjected to a development process, and accordingly, there is an advantageous effect in that the pressure sensitive adhesive composition can be prepared as a photoresist pattern.

The pressure sensitive adhesive composition according to the present invention includes a photoinitiator. The photoinitiator is not particularly limited as long as it is typically used in the art, and examples thereof include benzoin, benzoin methyl ether, benzoin ethyl ether, benzoin isopropyl ether, benzoin-n-butyl ether, benzoin isobutyl ether, acetophenone, hydroxy dimethyl acetophenone, dimethylamino acetophenone, dimethoxy-2-phenylacetophenone, 3-methylacetophenone, 2,2-dimethoxy-2-phenylacetophenone, 2,2-diethoxy-2-phenylacetophenone, 4-chloroacetophenone, 4,4-dimethoxy acetophenone, 2-hydroxy-2-methyl-1-phenylpropan-1-one, 4-hydroxy cyclophenylketone, 1-hydroxy cyclohexylphenylketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4-diaminobenzophenone, 4,4'-diethylaminobenzophenone, dichlorobenzophenone, anthraquinone, 2-methylanthraquinone, 2-ethylanthraquinone, 2-t-butylanthraquinone, 2-aminoanthraquinone, 2-methylthioxanthone, 2-ethylthioxanthone, 2-chlorothioxantone, 2,4-dimethylthioxanthone, 2,4-diethylthioxanthone, benzyldimethylketal, diphenylketone benzyldimethylketal, acetophenone dimethylketal, p-dimethylamino benzoic acid ester, 2,4,6-trimethylbenzoyl-diphenyl-phosphine oxide, fluorene, triphenylamine, carbazole, and the like. Further, as a commercially available product, Darocur 1173, Irgacure 184, Irgacure 907 (manufactured by Ciba Specialty Chemicals Inc.), and the like may also be used. These may be used either alone or in combination of two or more thereof.

The content of the photoinitiator is not particularly limited in the present invention, but the photoinitiator may be included in an amount of, for example, 0.1 to 10 parts by weight, preferably 0.5 to 5 parts by weight, and more preferably 1 to 3 parts by weight based on the total 100 parts by weight of the pressure sensitive adhesive composition. When the content of the photoinitiator satisfies the range, an pressure sensitive adhesive composition having excellent pressure sensitive adhesive strength and excellent hardness when cured may be obtained. When the content of the photoinitiator is less than the range, defects may occur due to slightly insufficient cohesion, and when the content of the photoinitiator is more than the range, there may occur a problem in that pressure sensitive adhesive strength may slightly deteriorate, so that it is preferred that the photoinitiator is included in an amount within the range.

Another aspect of the present invention relates to an pressure sensitive adhesive pattern including a cured product of the aforementioned pressure sensitive adhesive composition and having a glass transition temperature (Tg) of 0° C. or less.

Since the pressure sensitive adhesive pattern according to the present invention has a Tg of 0° C. or less, specifically, −10° C. to −40° C., there is an advantageous effect in that the pressure sensitive adhesive pattern exhibits adhesion characteristics in which the pressure sensitive adhesive pattern is easily adhered even at weak pressure and room temperature.

A method of forming an pressure sensitive adhesive pattern is not limited thereto, but the pressure sensitive adhesive pattern may be prepared by applying the aforementioned adhesive pressure sensitive adhesive composition according to the present invention on a base material and photocuring and developing the pressure sensitive adhesive composition to form a pattern.

Specifically, a smooth coating film is obtained by applying an pressure sensitive adhesive composition on a base material, and then heat-drying the pressure sensitive adhesive composition to remove volatile components such as a solvent.

The application method may be carried out by, for example, a spin coating method, a casting application method, a roll application method, a slit and spin coating or slit coating method, and the like. After application, volatile components such as a solvent are volatilized by heat-drying (prebaking) or reduced-pressure drying the pressure sensitive adhesive composition, and then heating the pressure sensitive adhesive composition. The thus-obtained coating film is irradiated with UV rays through a mask for forming a desired pattern. In this case, it is preferred that a device such as a mask aligner or a stepper is used in order to uniformly irradiate an entire exposed part with parallel light beams and accurately align the mask and the substrate. When the coating film is irradiated with UV rays, a portion irradiated with UV rays is cured, and as the UV ray, g-line (wavelength: 436 nm), h-line, i-line (wavelength: 365 nm), and the like may be used. The dose of UV radiation may be appropriately selected, if necessary, and is not particularly limited in the present invention. The coating film which is completely cured may be brought into contact with a developing solution to dissolve and develop an unexposed part, thereby forming a pattern with a desired shape.

As the developing method, any one of liquid addition, a dipping method, a spraying method, and the like may be used. Further, the substrate may be inclined at any angle during development.

In still another different exemplary embodiment of the present invention, the pressure sensitive adhesive pattern may be a photoresist pattern. Specifically, the pressure sensitive adhesive pattern may be a dry film photoresist pattern.

Since the pressure sensitive adhesive pattern according to the present invention includes: an acrylic copolymer including a repeating unit derived from an acrylate-based monomer having a Tg of −20° C. or less and a repeating unit derived from an unsaturated carboxylic acid monomer; a multifunctional acrylate-based compound; and a photoinitiator, it can be formed as a pattern having alkali solubility prior to curing and having improved pressure sensitive adhesiveness through selective curing and development by selective exposure through a mask.

Hereinafter, the present specification will be described in detail with reference to Examples in order to specifically explain the present specification. However, the Examples according to the present specification may be modified in various forms, and it should not be interpreted that the scope of the present specification is limited to the Examples described below in detail. The Examples of the present specification are provided to more completely explain the present specification to a person of ordinary skill in the art. Further, "%" and "parts" denoting the content below is a weight standard unless otherwise specified.

Synthesis of Acrylic Copolymer

Synthesis Example 1: Acrylic Copolymer 1

70 parts by weight of butyl acrylate, 30 parts by weight of acrylic acid, and 80 parts by weight of an ethyl acetate solvent were introduced into a reactor, and the temperature of the outer part of the reactor was increased to 80° C. While the same temperature was maintained, a solution in which 3 parts by weight of an AIBN initiator were dissolved in 20 parts by weight of ethyl acetate was added to the reactor, and the mixture was reacted at the same temperature for 6 hours, thereby obtaining Acrylic Copolymer 1 having a solid content of 50% and a weight average molecular weight of 55,000.

Synthesis Example 2: Acrylic Copolymer 2

Preparation was performed in the same manner as the preparation of Acrylic Copolymer 1, 3 parts by weight of glycidyl methacrylate were additionally added to the obtained copolymer solution while maintaining the temperature at the same temperature of 80° C., and the mixture was additionally reacted for 1 hour by adding 1 part by weight of triethylamine as a catalyst thereto, thereby obtaining Acrylic Copolymer 2.

After the reaction, the solvent and the contained residual monomer were analyzed by using gas chromatography, and it was confirmed that 95% or more of glycidyl ether had been reacted.

Synthesis Example 3: Acrylic Copolymer 3

Acrylic Copolymer 3 having a molecular weight of 78,000 was obtained in the same manner as in Synthesis Example 1, except that methyl acrylate having a Tg of 10° C. was used instead of butyl acrylate.

Synthesis Example 4: Acrylic Copolymer 4

Acrylic Copolymer 4 having a molecular weight of 34,000 was obtained in the same manner as in Synthesis Example 1, except that hydroxyethyl acrylate was used instead of acrylic acid.

Synthesis Example 5: Acrylic Copolymer 5

Acrylic Copolymer 5 having a molecular weight of 47,000 was obtained in the same manner as in Synthesis Example 1, except that 95 parts by weight of butyl acrylate and 5 parts by weight of acrylic acid were used instead of 70 parts by weight of butyl acrylate and 30 parts by weight of acrylic acid.

Examples and Comparative Examples: Preparation of Pressure Sensitive Adhesive Pattern Example 1

After an pressure sensitive adhesive composition was prepared by diluting 60 parts by weight of the copolymer solid content obtained in Synthesis Example 1, 40 parts by weight of the multifunctional acrylate-based compound represented by Chemical Formula 1, and 2 parts by weight of the Irgacure-184 (manufactured by Ciba Specialty Chemicals Inc.) photoinitiator in an ethyl acetate solvent such that the concentration of the solid content became 30%, the pressure sensitive adhesive composition was applied on glass with a size of 100×100 cm² (manufactured by Corning, Inc., Eagle XG), dried at 100° C. by using a hot-air dryer for 3 minutes, and then exposed to a light intensity of 500 mJ by using a mercury lamp light source through a mask, and developed with an aqueous alkaline solution, thereby obtaining an pressure sensitive adhesive pattern.

[Chemical Formula 1]

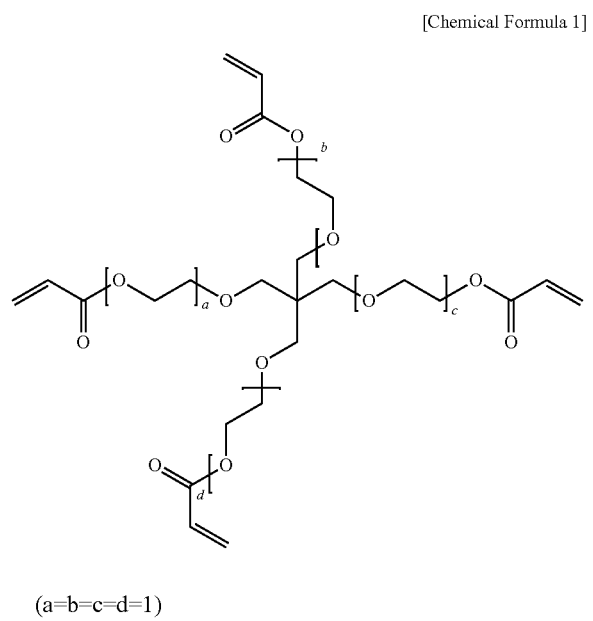

(a=b=c=d=1)

Example 2

Synthesis was performed in the same manner as in Example 1, except that the copolymer obtained in Synthesis Example 2 was used.

Comparative Example 1

Synthesis was performed in the same manner as in Example 1, except that the copolymer obtained in Synthesis Example 3 was used.

Comparative Example 2

Synthesis was performed in the same manner as in Example 1, except that the copolymer obtained in Synthesis Example 4 was used.

Comparative Example 3

Synthesis was performed in the same manner as in Example 1, except that the copolymer obtained in Synthesis Example 5 was used.

Experimental Example

Figure 2:
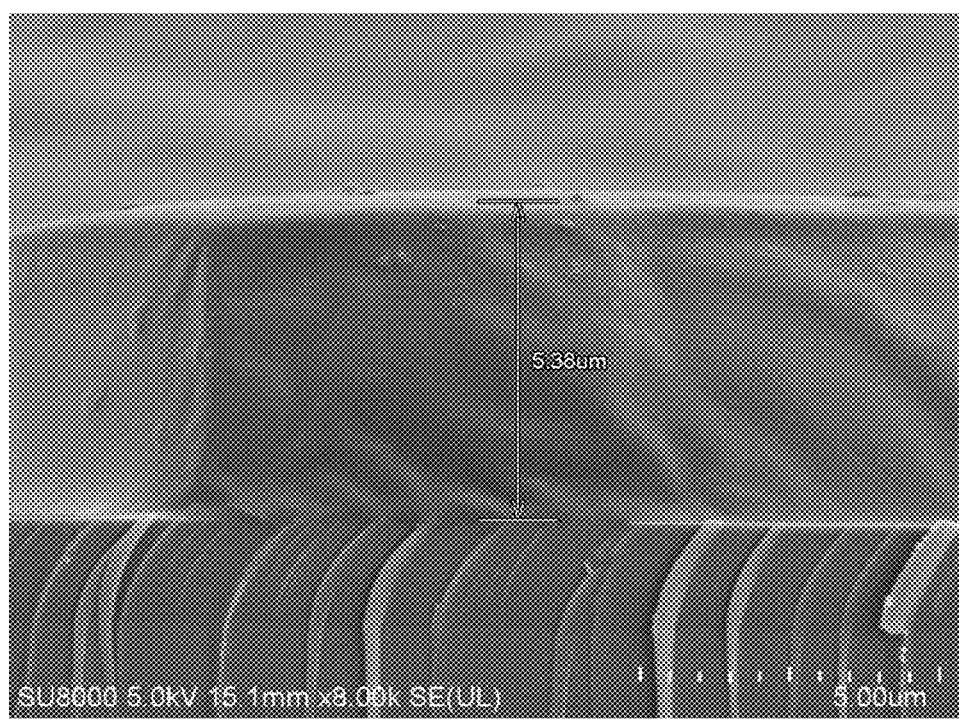

The cross-sectional images of the front surface and the side surface of the pressure sensitive adhesive pattern prepared according to Example 1 were observed by SEM (S-4300 manufactured by Hitachi, Ltd.), and are shown in FIG. 1 and FIG. 2, respectively.

The evaluation of pattern forming performance and pressure sensitive adhesive strength of the pressure sensitive adhesive patterns prepared according to Examples 1 and 2 and Comparative Examples 1 to 3 were performed, and the results are shown in the following Table 1.

Evaluation of Pattern Forming Performance

For evaluation of the pattern forming performance, a thin film was formed by applying each of the pressure sensitive adhesive compositions according to the Examples and the Comparative Examples on a 2 inch×2 inch glass substrate (manufactured by Corning, Inc., "EAGLE XG") by a spin coating method so that the thickness of the coating film after drying became 10 μm, and placed on a heating plate, and maintained at a temperature of 100° C. for 3 minutes. Thereafter, a test photomask having a 100 μm pattern was placed on the thin film, and irradiated with UV rays after setting a distance to the test photomask to 300 μm. In this case, the test photomask was irradiated at an illuminance of 60 mJ/cm² by using a 1 kW high pressure mercury lamp including all of the g, h, and i lines as an UV ray light source, and a special optical filter was not used. The thin film irradiated with UV rays was immersed in an aqueous KOH developing solution having a pH of 10.5 for 2 minutes and developed. The glass plate on which the thin film was applied was washed by using distilled water, and then dried by blowing nitrogen gas, and heated at 200° C. in a heating oven for 25 minutes, thereby forming each pattern.

The produced pattern was observed by an optical microscope, and the degree of peeling of the 100 μm pattern was evaluated in accordance with the following criteria during the observation with the naked eye.

○: No pattern stripping
Δ: 5 or more occurrences of pattern stripping
x: No pattern formed Evaluation of Pressure Sensitive Adhesive Strength For evaluation of the pressure sensitive adhesive strength, a thin film was formed by applying each of the pressure sensitive adhesive compositions according to the Examples and the Comparative Examples on a 2 inch×2 inch glass substrate (manufactured by Corning, Inc., "EAGLE XG") by a spin coating method so that the thickness of the coating film after drying became 10 μm, and placed on a heating plate, and maintained at a temperature of 100° C. for 3 minutes. Thereafter, the thin film was irradiated with UV rays without any mask, unlike the evaluation of the pattern forming performance. In this case, the thin film was irradiated at an illuminance of 60 mJ/cm² by using a 1 kW high pressure mercury lamp including all of the g, h, and i lines as an UV ray light source, and a special optical filter was not used. The thin film irradiated with UV rays was immersed in an aqueous KOH developing solution having a pH of 10.5 for 2 minutes and treated such that effect of the developing solution on the pressure sensitive adhesive layer during development became the same. The glass plate on which the thin film was applied was washed by using distilled water, and then dried by blowing nitrogen gas, and heated at 200° C. in a heating oven for 25 minutes, thereby manufacturing a sample for measuring pressure sensitive adhesive strength. The manufactured sample was cut into a width of 25 mm and a length of 100 mm, a triacetyl cellulose (TAC) film was attached to the sample by using a laminator, the sample was left to stand in a constant temperature and humidity chamber for 1 hour, and a peeling pressure sensitive adhesive strength (N/1 inch) was measured at a peel angle of 180° and a peel rate of 300 mm/min by using Autograph (AG-IS manufactured by Shimadzu Corporation).

In this case, the pressure sensitive adhesive strength was evaluated in accordance with the following criteria.

Strong adhesion: 1 N/1 inch or more

Weak adhesion: less than 1 N/1 inch.

TABLE 1

|  | Pattern Formation | Pressure sensitive adhesive Strength |
|---|---|---|
| Example 1 | ○ | Strong Adhesion |
| Example 2 | ○ | Strong Adhesion |
| Comparative Example 1 | ○ | Poor (not bonded) |
| Comparative Example 2 | x | Weak Adhesion |
| Comparative Example 3 | x | Weak Adhesion |

Referring to Table 1, it can be seen that the pressure sensitive adhesive compositions according to the Examples have excellent pattern forming performance and also have excellent pressure sensitive adhesive strength. In contrast, it can be seen that when the pressure sensitive adhesive compositions according to the Comparative Examples are used, the pattern forming performance is not excellent, or the pressure sensitive adhesive strength is weak. In particular, in the case of Comparative Example 3 where the acrylic monomer containing a carboxylic acid group is included in an amount of less than 10 parts by weight, it can be seen that a pattern is not formed.

Further, referring to FIG. 1 and FIG. 2, it can be seen that a pattern having a uniform film thickness is formed.

The invention claimed is:

1. A pressure sensitive adhesive composition comprising:
an acrylic copolymer;
a multifunctional acrylate compound; and
a photoinitiator,
wherein the acrylic copolymer comprises a repeating unit derived from an acrylate monomer having a Tg of −20° C. or less and a repeating unit derived from an unsaturated carboxylic acid monomer, and
the repeating unit derived from the unsaturated carboxylic acid monomer is comprised in an amount of 10 to 50 parts by weight based on a total 100 parts by weight of the acrylic copolymer, and
wherein the multifunctional acrylate compound comprises two or more first photocurable functional groups; and one or more functional groups selected from the group consisting of an acid group and an ethylene glycol group in a molecule thereof.

2. The pressure sensitive adhesive composition according to claim 1,
wherein the multifunctional acrylate compound is represented by the following Chemical Formula 1 or Chemical Formula 2:

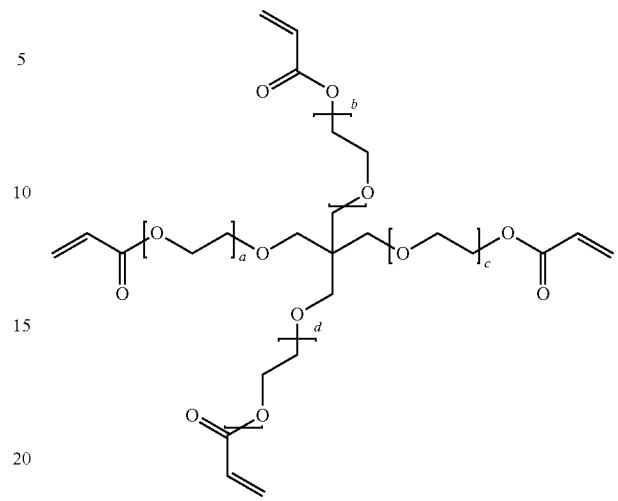

[Chemical Formula 1]

in Chemical Formula 1,
a to d each are an integer of 0 to 10, and a+b+c+d=an integer of 4 to 40

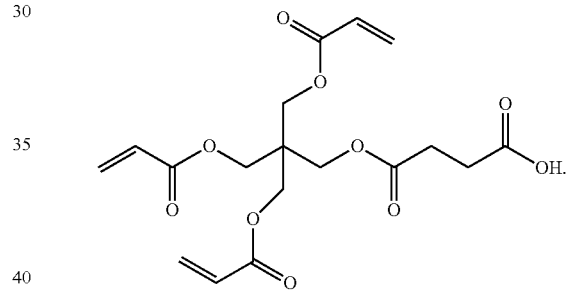

[Chemical Formula 2]

3. The pressure sensitive adhesive composition according to claim 1,
wherein the acrylic copolymer has a weight average molecular weight of 10,000 to 100,000.

4. The pressure sensitive adhesive composition according to claim 1, wherein the repeating unit derived from the acrylate monomer is comprised in an amount of 50 to 90 parts by weight based on the total 100 parts by weight of the acrylic copolymer.

5. The pressure sensitive adhesive composition according to claim 1, wherein the acrylic copolymer further comprises a second photocurable functional group.

6. The pressure sensitive adhesive composition according to claim 5, wherein the second photocurable functional group is comprised in an amount of 1 to 20 parts by weight based on 100 parts by weight of the total repeating units in the acrylic copolymer.

7. The pressure sensitive adhesive composition according to claim 1, wherein the multifunctional acrylate compound is comprised in an amount of 10 to 60 parts by weight based on the total 100 parts by weight of the pressure sensitive adhesive composition.

8. An pressure sensitive adhesive pattern comprising a cured product of the pressure sensitive adhesive composition according to claim 1 and having a Tg of 0° C. or less, wherein the pressure sensitive adhesive pattern is a photoresist pattern.

\* \* \* \* \*